US006833201B2

(12) United States Patent
Czerw et al.

(10) Patent No.: US 6,833,201 B2
(45) Date of Patent: Dec. 21, 2004

(54) NANOSTRUCTURED-DOPED COMPOUND FOR USE IN AN EL ELEMENT

(75) Inventors: Richard Czerw, Clemson, SC (US); David Carroll, Central, SC (US); Sakutaro Hoshi, Central, SC (US)

(73) Assignees: Clemson University, Clemson, SC (US); Yazaki Corporation, Tokyo (JP)

(*) Notice: Subject to any disclaimer, the term of this patent is extended or adjusted under 35 U.S.C. 154(b) by 0 days.

(21) Appl. No.: 10/356,702

(22) Filed: Jan. 31, 2003

(65) Prior Publication Data

US 2004/0150328 A1 Aug. 5, 2004

(51) Int. Cl.[7] .............................................. H05B 33/00
(52) U.S. Cl. ..................... 428/690; 428/917; 313/504; 313/506; 252/301.16
(58) Field of Search ................................ 428/690, 917; 313/504, 506; 252/301.16

(56) References Cited

U.S. PATENT DOCUMENTS

| | | | |
|---|---|---|---|
| 4,663,230 A | 5/1987 | Tennent | |
| 5,627,140 A | 5/1997 | Fossheim et al. | |
| 6,183,714 B1 | 2/2001 | Smalley et al. | |
| 6,203,814 B1 | 3/2001 | Fisher et al. | |
| 6,344,272 B1 | 2/2002 | Oldenburg et al. | |
| 6,361,885 B1 | 3/2002 | Chou | |
| 6,414,104 B1 | 7/2002 | Pei | |
| 6,422,450 B1 | 7/2002 | Zhou et al. | |
| 6,530,944 B2 | 3/2003 | West et al. | |
| 6,555,945 B1 | 4/2003 | Baughman et al. | |
| 6,582,876 B2 | 6/2003 | Wolk et al. | |
| 2001/0002275 A1 | 5/2001 | Oldenburg et al. | |
| 2002/0048706 A1 | 4/2002 | Mayes et al. | |
| 2002/0192441 A1 | 12/2002 | Kalkan et al. | |
| 2002/0193551 A1 | 12/2002 | Pei | |
| 2003/0013843 A1 | 1/2003 | Pei | |
| 2003/0019517 A1 | 1/2003 | McFarland | |
| 2003/0066960 A1 | 4/2003 | Colbert et al. | |

FOREIGN PATENT DOCUMENTS

JP 06179802 A * 6/1994

OTHER PUBLICATIONS

Article—*Measurement of the $S_0$–$T_1$ energy gap in poly(2–methoxy,5(2'–ethyl–hexoxy)–p–phenylenevinylene) by triplet–triplet energy transfer*, A. P. Monkman, H. D. Burrows, M. da G. Miguel, I Hamblett, and S. Navaratnam, Chemical Physics Letters 307, 1999, pp. 303–309.

Article—*Triplet State Dynamics on Isolated Conjugated Polymer Chains*, Hugh D. Burrows, J. Seixas de Melo, C. Serpa, L.G. Arnaut, Maria da Graca Miguel, Andrew P. Monkman, I, Hamblett, and S. Navaratnarn, UPS'01— Displays, 1 page, 2001, p. C–1.

Abstract—*Near–Field Scanning Optical Microscopy (NSOM) Studies of Alkyl–Substituted Polyfluorene Thin Films*, Julie Teetsov and David Vanden Bout, Session F36— Solid State Surfaces, Oct. 29, 1 page, no year.

Article—*Aligned Carbon Nanotube Arrays Formed by Cutting a Polymer Resin–Nanotube Composite*, P. M. Ajayna, O. Stephan, C. Colliex and D. Trauth, Science, New Series, vol. 265, Issue 5176, Aug. 26, 1994, pp. 1212–1214.

(List continued on next page.)

*Primary Examiner*—Dawn Garrett
(74) *Attorney, Agent, or Firm*—Dority & Manning, P.A.

(57) ABSTRACT

A compound for use in an electro luminescent (EL) device. The compound includes a first substance in combination with a second substance. The first substance includes nanostructures in combination with an equal weight percentage of PPV derivative, whereas the second substance is a PPV derivative. The first substance makes up from greater than 0 wt % to about 3 wt % of the compound, whereas the second substance makes up the remainder. Also, an EL device made from the compound, and a method of making the EL device, are disclosed.

35 Claims, 3 Drawing Sheets

OTHER PUBLICATIONS

Article—*Nanotubes as nanoprobes in scanning probe microscopy*, Hongjie Dai, Jason H. Hafner, Andrew G. Rinzler, Daniel T. Colbert and Richard E. Smalley, Nature, vol. 384, Nov. 14, 1996, pp. 147–150.

Article—*Polyamide 6/Silica Nanocomposites Prepared by In Situ Polymerization*, Feng Yang, Yuchun Ou, and Zhongzhen Yu, Journal of Applied Polymer Science, vol. 69, 1998, pp. 355–361.

Article—*Nanotubes from Carbon*, P. M. Ajayan, Chem, Rev., vol. 99, 1999, pp. 1787–1799.

Article—*Growth of nanotubes for probe microscopy tips*, Nature, vol. 398, Apr. 29, 1999, pp. 761–762.

Article—*Fluoropolymer Nanotube copmosites For Coatings And Nanoscopic Probes*, Polym. Mater. Sci. & Eng. (ACS Div. PMSE), vol., 82, 2000, p. 300.

Article—*Property Tailored Perfluorocyclbutyl (PFCB) Copolymers for Optical Devices*, Dennis W. Smith, Jr., Suresh M. Kumar, Shengrong Chen, John M. Ballato, Erik J. Nelson, Jack J. Jin and Stephen H. Foulger, SPIE Proc., vol. 4439, 2001, pp. 51–62.

U.S. patent application Ser. No. 10/103,562, Carroll et al., Halogen Containing–Polymer Nanocomposite Compositions, Methods, And Products Employing Such Compositions, filed Mar. 21, 2002.

* cited by examiner

NANOSTRUCTURED-DOPED COMPOUND FOR USE IN AN EL ELEMENT

FIELD OF THE INVENTION

The present invention relates to electroluminescent (EL) devices, such as self-light-emitting elements, that can be used as light sources for flat-type self-light-emitting display devices for purposes such as communications and illumination. For example, the flat-type self-light-emitting elements of the present invention may be used in automotive instrument display panels. More particularly, the present invention relates to materials used in such EL devices.

BACKGROUND OF THE INVENTION

In general, an EL device is a spontaneously luminous element characterized by injecting electrons and electron holes into an inorganic or organic layer kept between electrodes, and recombining them in a luminous layer. It is important to efficiently recombine the carriers (electrons and holes) in the luminous layer. EL devices are broadly divided into two types: inorganic and organic.

The inorganic type EL device is further divided into two types: dispersion and thin-film. In each of these types, a high-voltage alternating current (AC) is disadvantageously required to drive the devices. Additionally, the red color is weak and the number of colors is small. Further, although the dispersion type EL device can be manufactured by a relatively easy and low-cost method, such as screen printing, its useful life is short. Thus, it has been put to practical use as a backlight in a wrist watch or the like. In contrast to the dispersion type of EL device, the thin-film type requires a dry manufacturing method, such as vacuum deposition, having facilities similar to those for semiconductor manufacture. Therefore, this type of EL device is costly to produce. Nonetheless, Nippondenso Co., Ltd. has put such an EL device to practical use in a vehicle, and Sharp Corp. has put it to use in an electric scoreboard. Costs are further increased for both types of inorganic EL devices because they require a costly high-voltage AC drive circuit.

The organic type of EL device is also divided into two types: low-molecular and high-molecular. In each of these types, a low-voltage direct current (DC) is required to drive the devices. Further, red, green, and blue, colors reach levels that can be used practically. With respect to the driving principles and the structures, no difference exists between the low-molecular type EL device and high-molecular type EL device. However, the high-molecular type EL device can be manufactured by a wet type technique, such as spin coating, whereas the low-molecular type is manufactured by vacuum deposition or the like as in the case of the inorganic thin-film type EL device. Pioneer Electronic Corp. has put the low-molecular organic EL device to practical use as a display for a vehicle-mounted audio system, whereas N. V. Philips' Gloeilampenfabrieken has put the high-molecular organic EL device to practical use as a segment type display for a portable telephone.

Although each of these types of EL device has achieved some practical use, there is room for improvement with respect to driving voltage requirements, useful life, brightness or luminous efficiency, and manufacturing techniques. By luminous efficiency, it is meant the ratio of an amount of input current to an amount of output light. If the current input to the EL device, i.e., the carriers, are all converted into visible light, an internal efficiency is 100%. However, the recombining of holes and electrons actually takes place outside of the luminous layer so that much of the carriers are converted into thermal vibrations or energy other than visible light. Thus, the internal efficiency for most EL devices is actually around several percent.

The main causes for deterioration of the organic EL element are the following: penetration into, and attachment to, the element by the active molecules of water, as well as the change in properties of the element itself.

SUMMARY OF THE INVENTION

An object of the present invention is to decrease the required driving voltage for EL devices. Another object of the present invention is to increase the useful life of EL devices. Still another object of the present invention is to enhance the brightness, or luminous efficiency, of EL devices. Another object of the present invention is to simplify the manufacturing technique for EL devices. Yet another object of the present invention is to more uniformly disperse the doping nanostructures within the layers of EL devices.

The above and other objects of the invention can be achieved by doping nanostructures into the layers of EL devices and, in particular, into the luminous layer of EL devices. Further, the present invention uniformly distributes the doping nanostructures through the various layers that make up EL devices.

The nanostructures may be fullerenes, single walled carbon nanotubes (SWNTs), multi-walled carbon nanotubes (MWNTs), fullerenes, porphorines, metal filled nanotubes, and the like. Further, the carbon nanotubes may be shortened, long, doped with boron, doped with nitrogen, or pure. Especially, B-doped carbon nanotubes and N-doped carbon nanotubes can be used to better match the energy levels of the polymer with the ionized potential (IP) of the nanotube. In the present specification, the term "carbon nanotube" includes carbon nanotubes and doped carbon nanotubes and structures. Further, boron nitride nanotubes may be used as the nanostructures of the present invention, i.e., instead of, or in addition to, the carbon nanostructures. As used herein, and in accordance with that well known in the art, the term "fullerenes" includes carbon cluster compounds represented by $C_{60}$, $C_{70}$, $C_{76}$, $C_{78}$, $C_{82}$, $C_{84}$, $C_{90}$, $C_{96}$, and $C_{140}$, for example.

Examples of the host include PPV, MEH-PPV, DOOHPPV, POMPV, PmPV, PFO, PFO-red, PFO-blue, PANi, PP, and so forth.

More particularly, the present invention includes doping carbon nanostructures into PPV, especially by first combining the carbon nanostructures with a PPV derivative. That is, a first substance is formed comprising carbon nanostructures and PPV containing carbazole units, wherein the carbon nanostructures and PPV containing carbazole units are present in a 1:1 ratio. The PPV containing carbazole units preferably is poly [(2,5-di-pentoxyl-phenylene)-4-diylvinylene-3,6-(9-(1-azafulleroid-propyl) carbazolenevinylene)], and the carbon nanostructures are preferably fullerenes, whereby the first substance is PPV-AFCAR.

Then, an amount—ranging from greater than 0 wt % to 3 wt %—of the first substance is then combined with a second PPV. More specifically, this second PPV preferably is poly{1,4[2-(3,7-dimethyloctyloxy)3,5,6-trimethoxy] phenylene vinylene} or POMPV, whereby a compound for use as a layer of an EL device is formed. This compound includes many advantages over the related art.

First, doping carbon nanostructures into the layers of EL devices reduces the required driving voltage. Second, doping carbon nanostructures into the layers of EL devices leads to a longer useful life for the EL device. Third, doping carbon nanostructures into the layers of EL devices enhances the brightness of the EL devices. More specifically, the present invention achieves a higher luminance and external efficiency due to enhanced recombination dynamics. Fourth, doping carbon nanostructures into the layers of EL devices leads to simplified manufacturing techniques.

Further, although doping carbon nanostructures into the layers of EL devices has many advantages, if the carbon nanostructures aggregate, they can lead to current leaks. Such current leaks degrade the performance of the EL device as a whole. Therefore, it is important to uniformly disperse the carbon nanostructures throughout the layer of the EL device into which they are doped. In order to more uniformly disperse the carbon nanostructures in a layer of an EL device, as well as to obtain a good connection between the dopant carbon nanostructures and the host material, the carbon nanostructures are first compounded with, or attached to, a derivative of the layer into which they will be doped, thereby forming a first substance. This first substance, including the carbon nanostructures, is then doped into the material that forms the desired layer in an EL device. It is easy to form the desired layer of the EL device in this manner, therefore EL devices of the present invention easily can be synthesized in large quantities for industrial utilization.

In particular, the above and other objects can be achieved by providing a compound, for use in an EL device, comprising from greater than 0 wt % to 3 wt % of a first substance comprising about 50 wt % carbon nanostructures and about 50 wt % of a PPV derivative, and the remainder comprising a second PPV derivative.

Additionally, the above and other objects can be achieved by providing a compound for use in an EL device, comprising a first substance comprising a carbon nanostructure covalently linked to a PPV molecule containing a carbazole unit; and a second substance comprising a PPV derivative different from the PPV molecule containing a carbazole unit.

Further, the above and other objects can be achieved by providing an EL device comprising a cathode; an anode; a light emitting layer disposed between the cathode and the anode, whereby when a potential is applied across the cathode and the anode, the light emitting layer emits light, and wherein the light emitting layer comprises a compound as set forth above.

Moreover, the above and other objects can be achieved by providing a method of making an EL device, comprising providing a substrate; covering the substrate with a buffer layer; depositing a layer of a compound onto the buffer layer, wherein the compound is as set forth above, and acts as an emissive layer; disposing an electron transport layer on the emissive layer; and disposing a cathode on the electron transport layer.

Other features and aspects of the present invention are discussed in greater detail below.

BRIEF DESCRIPTION OF THE DRAWINGS

A full and enabling disclosure of the present invention, including the best mode thereof to one of ordinary skill in the art, is set forth more particularly in the remainder of the specification, including reference to the accompanying figures in which.

Repeat use of reference characters in the present specification and drawings are intended to represent same or analogous features or elements.

DETAILED DESCRIPTION OF THE REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Although the present invention will mainly be described with reference to the high-molecular type organic EL device, the principles herein can be applied to any of the above-described types of EL devices.

According to a first embodiment of the present invention, there is provided a compound for use in an EL device. The compound includes two parts: a first part including dopant nanostructures and a PPV derivative; and a second part including a second PPV substance. The nanostructures are covalently linked to the PPV derivative to form a first substance, and then the first substance is mixed with the second PPV substance to form the compound.

In the first substance, the nanostructures may be carbon nanostructures, fullerenes, single walled carbon nanotubes (SWNTs), multi-walled carbon nanotubes (MWNTs), and the like. Further, the carbon nanotubes may be shortened, long, doped with boron, doped with nitrogen, or pure. Still further, the nanostructures may be boron nitride nanotubes. As used herein, and in accordance with that well known in the art, the term "fullerenes" includes carbon cluster compounds represented by $C_{60}$, $C_{70}$, $C_{76}$, $C_{78}$, $C_{82}$, $C_{84}$, $C_{90}$, $C_{96}$, and $C_{140}$, for example.

These nanostructures are then combined with a PPV derivative. Preferably, a first substance is formed comprising the nanostructures and PPV containing carbazole units, wherein the nanostructures and PPV containing carbazole units are present in a 1:1 ratio.

The PPV containing carbazole units preferably is poly [(2,5-di-pentoxyl-phenylene)-4-diylvinylene-3,6-(9-(1-azafulleroid-propyl) carbazolenevinylene)], and the carbon nanostructures are preferably fullerenes, whereby the first substance is PPV-AFCAR. An exemplary process for preparing the PPV-AFCAR relies on the cycloaddition reaction of an azide group with $C_{60}$. This method provides a simple, and versatile, manner for synthesizing polymers containing a fullerene moiety due to the ease of preparation of azide-containing polymers, the lack of cross-linking, and the retention of the fullerenes' electronic properties. The exemplary method is as follows. Functionalized B-doped and functionalized N-doped SWNTs can be functionalized and used in the same way as that described for the $C_{60}$ below.

Figure 1:
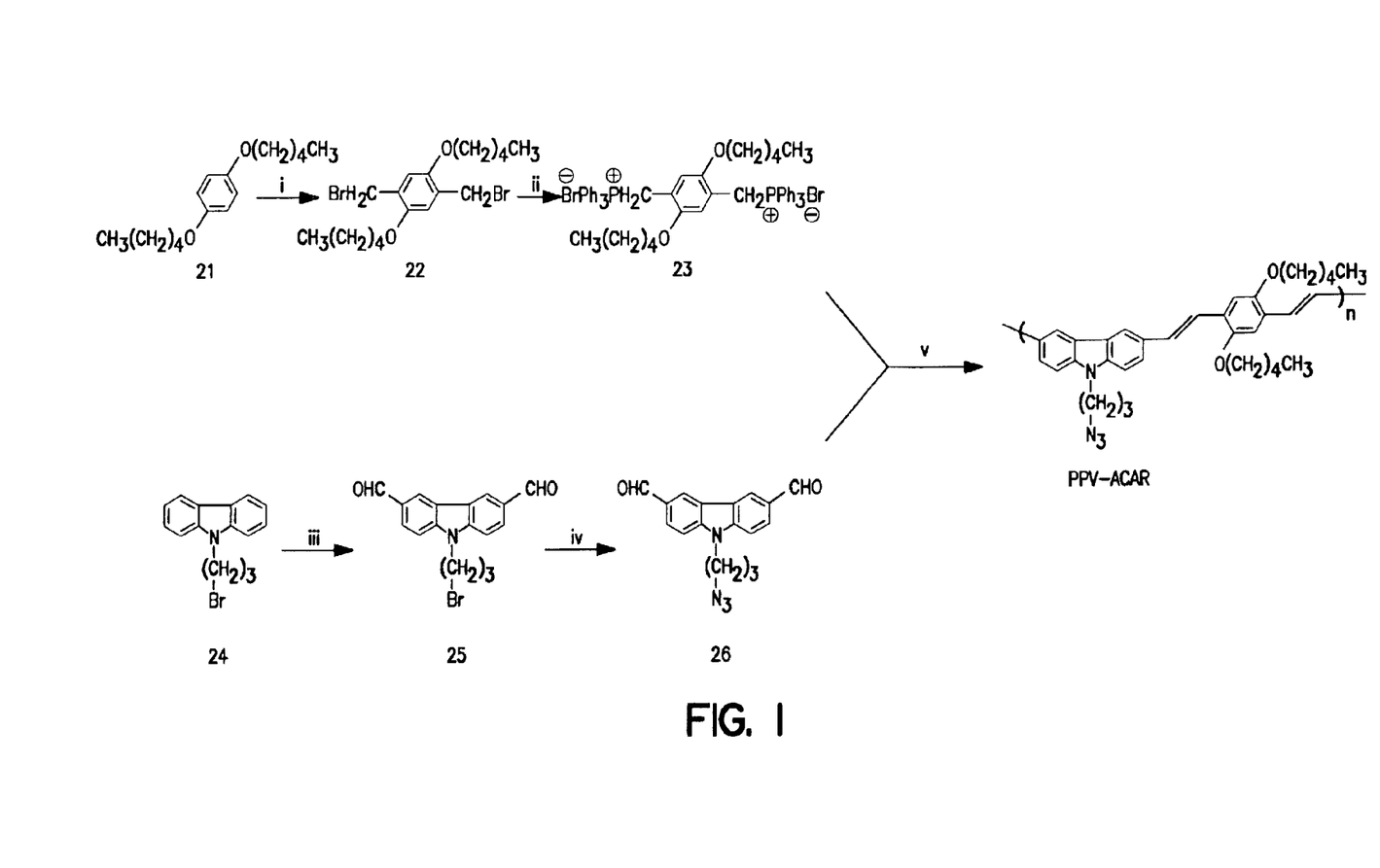
FIG. 1 is a representative reaction showing the production of PPV-ACAR.
Figure 2:
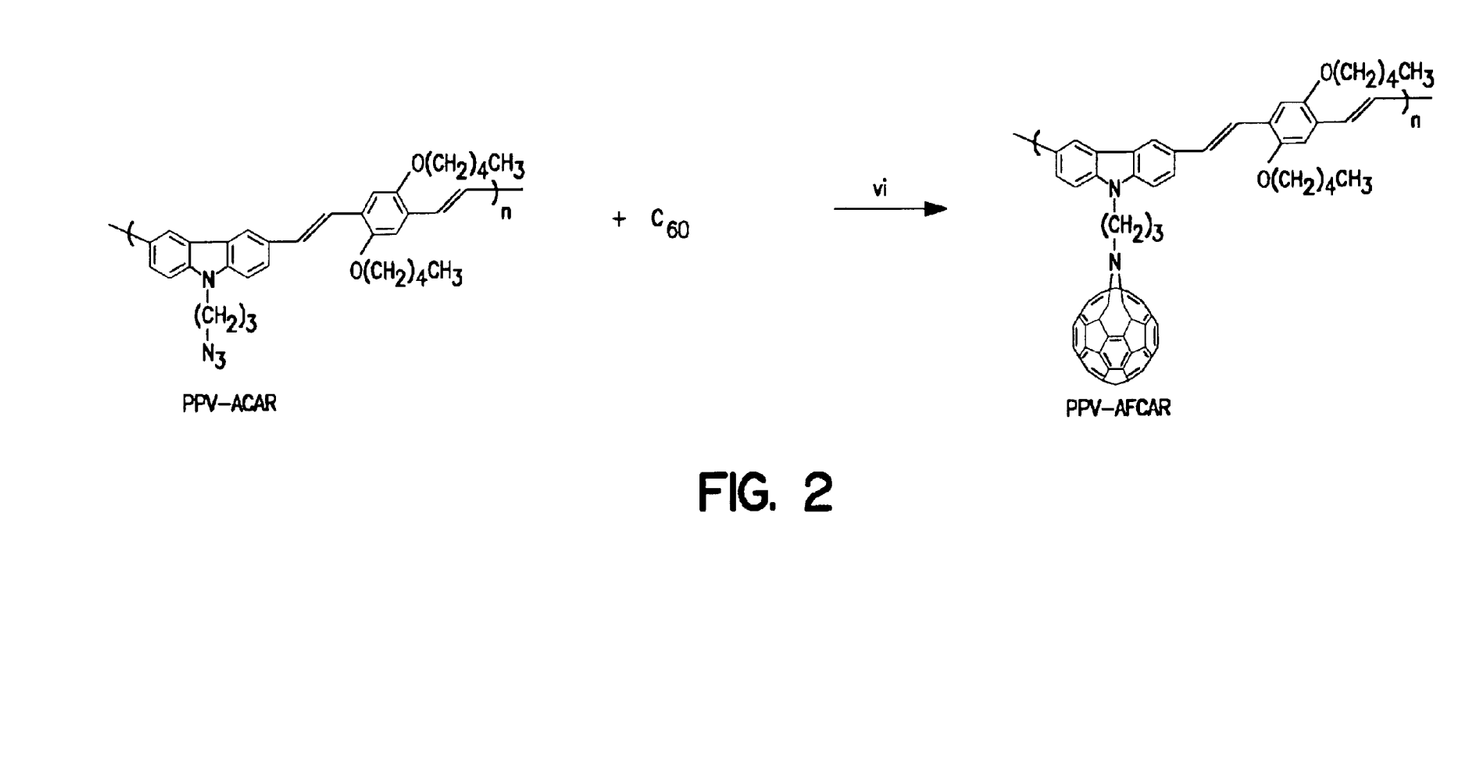
FIG. 2 is a representative reaction showing the combination of $C_{60}$ and PPV-ACAR to form PPV-AFCAR.

The starting polymer can be an azido-polymer comprising poly[(2,5-di-pentoxyl-phenylene)-4-diylvinylene-3,6-(9-(1-azido-propyl) carbazolenevinylene)], (hereinafter PPV-ACAR). The PPV-ACAR may be synthesized by the well-known Wittig reaction of compound 23 with compound 26 under sodium ethoxide in chloroform/ethanol solvent (FIG. 1). Then, a mixture of PPV-ACAR and one equivalent of $C_{60}$ may be reacted in chlorobenzene reflux for about 24 hours (FIG. 2). After removal of the solvent, the crude reaction mixture may be re-dissolved in dichloroethane and filtered to remove unreacted $C_{60}$. Precipitation into hexane will then yield the PPV-AFCAR as a dark brown powder, which is the first substance of the compound for use in an EL device.

An amount—ranging from greater than 0 wt % to 3 wt %—of the first substance is then combined with a second PPV, whereby a compound for use as a layer of an EL device is formed.

The second PPV can be pure PPV or various derivatives thereof. Preferably, this second PPV is poly{1,4[2-(3,7-dimethyloctyloxy)3,5,6-trimethoxy] phenylene vinylene} or POMPV. And this second PPV comprises the remainder—i.e., from 97 wt % to less than 100 wt %—of the compound for use in an EL device. An exemplary method for making the POMPV is as follows.

The POMPV may be prepared by the reaction of 1,4-bis (chloromethyl)-3,5,6-trimethoxy-2-(3,7-dimethyl-octyloxy)-benzene (BCM MOB) and potassium t-butoxide under anhydrous tetrahydrofuran (THF).

The PPV unit containing carbazole, in the PPV-AFCAR, led to good compatibility with the host POMPV whereby they could form homogeneity in chloroform. Thus, these blends had good processability for fabricating devices.

Compared with the PPV-ACAR, the FT-IR spectroscopy of PPV-AFCAR showed that a strong band at 2097 $cm^{-1}$ for the azide group had completely disappeared and a new strong absorption at 527 $cm^{-1}$ for the $C_{60}$ appeared. The molecular weights of PPV-ACAR and PPV-AFCAR were determined by a Waters 2410 gel permation chromatography (GPC) instrument with polystyrene as a standard. The weight-average molecular weights ($M_w$) were 2357 for PPV-ACAR and 2307 for PPV-AFCAR; however, the polydispersity index increased from 1.35 for PPV-ACAR to 2.04 for PPV-AFCAR. The polymer PPV-AFCAR was only partially soluble in THF, therefore its actual molecular weight should be higher than the measured value because the insoluble parts possessed higher molecular weights. Nonetheless, PPV-AFCAR causes an even distribution of $C_{60}$ through the POMPV; i.e., there was no aggregation that lead to current leaks.

The weight percent of $C_{60}$ in PPV-AFCAR was obtained using the quantitative UV-Vis method (comparison PPV-ACAR with $C_{60}$), which was found to be 68.8%. The thermal properties of PPV-AFCAR were investigated by thermo-gravimetric analysis (TGA), which showed good thermal stability up to 350° C., whereas a small amount of weight loss occurred in the 380–460° C. The UV-Vis spectra of PPV-AFCAR corresponded to the two components of $C_{60}$ moiety and PPV units, and showed the three characteristic absorption bands in 200–350 nm region as well as a very weak band at 345 nm corresponding the $\pi$-$\pi$* transition of the PPV conjugated unit. In $CHCl_3$, precursor PPV-ACAR displayed fluorescence maximums at 469 nm and 491 nm. The PPV-AFCAR exhibited an emission spectrum with characteristic features of the PPV unit, however, the luminescence was strongly quenched. This quenching may result from the photo-induced energy or electron transfer from the PPV units to the $C_{60}$ moiety.

Although, as described above, the nanostructures and the PPV containing carbazole units are combined in a 1:1 ratio to form the first substance, such need not be the case. That is, the important thing is to have the proper amount of nanostructures present in the compound that will be used as a layer in an EL device. Therefore, in general, if less than 50 wt % of the first substance is nanostructures, then more of the first substance can be used to make the compound. Similarly, if there is more than 50 wt % of the first substance is nanostructures, then less of the first substance can be used to make the compound.

Further, the amount of nanostructures that are doped into a layer of an EL device can vary. However, if too many nanostructures are doped into the layers including the glass substrate to the luminescent layer, then they will optically inhibit the luminous efficiency of the EL device because the nanostructures absorb light. On the other hand, if there are not enough nanostructures, there will not be a sufficient hole trapping effect so that luminous efficiency will not be improved. Therefore, because the optical influence is smaller on the side of the electron transfer layer, the electron injection layer, and the metal electrode of the cathode, it may be more effective to apply a larger amount of nanostructures on such side of the EL device than on the side having the hole injection, hole transportation, and luminescent layers of the EL device. That is, it is more effective, optically, to place the dopant nanostructures on the side of the EL device opposite to that from which the luminescent layer will be viewed.

Additionally, the amount of nanostructures may vary depending on the type of nanostructure and on the luminescent color of the EL device. That is, fullerenes in solution have an absorption wavelength with peaks changing between seven different colors as the fullerene changes from $C_{60}$ to $C_{140}$. Thus, an appropriate fullerene and amount thereof depend on the desired color of EL emission. Further, there is a proper amount of nanostructures with respect to their electrical effect on the EL device. That is, since the band gap differs among luminescent materials having different luminescent colors, the optimum amount of nanostructure dopant for enhancing the EL device's electrical characteristic will vary depending on the luminescent color.

Figure 3:
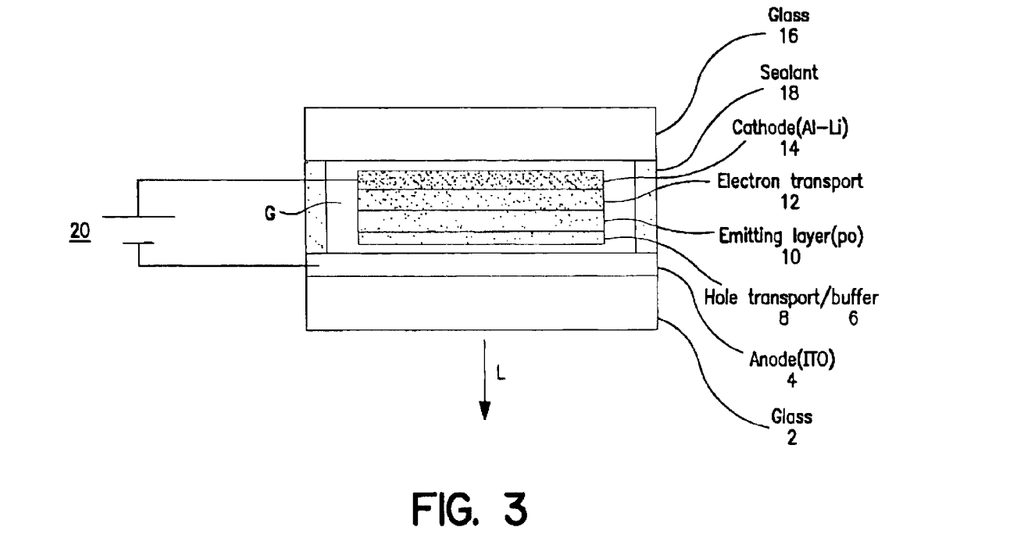
FIG. 3 is a schematic diagram of an EL device.

The above-described compound—containing nanostructures bonded with a PPV derivative, doped into combination with a second PPV derivative—is then used as one of the layers in an EL device. One embodiment of an EL device is shown in FIG. 3. A glass layer 2 is used as a substrate. An anode 4 is disposed on the glass layer 2. A buffer layer 6 is disposed on the anode 4, and a hole transportation layer 8 is disposed on the buffer layer 6. Alternatively, the buffer layer 6 and hole transportation layer 8 may be formed as one layer. Then, an emitting layer 10 is disposed on the hole transportation layer 8, whereas an electron transportation layer 12 is disposed on the emitting layer 10. Further, a cathode 14 is disposed on the electron transportation layer 12.

Examples of the materials that may be used for the various layers in the EL device are as follows. The anode 4 may be an iridium titanium oxide (ITO) layer, whereas the buffer layer 6 may include polyethylenedioxythiophene (PEDOT). When PEDOT is used, the buffer layer 6 and hole transportation layer 8 may be combined into one layer that is comprised of PEDOT. The emitting layer 10 can be made of the above-described compound for use in an EL device. The electron transportation layer 12 may include PBD, which may be disposed on the emitting layer 10 by vacuum evaporation. The cathode 12 may include LiF and aluminum. Although specific materials have been described for the layers 4–8 and 12 of the EL device, these materials are merely exemplary, and any other suitable material may be substituted therefor. As for the emitting layer 10, its composition can vary according to the description for the compound as set forth above.

A second glass 16 is supported on the anode 4 by a sealant 18, so as to form-along with glass 2 and anode 4—a chamber around the layers 6, 8, 10, and 12 of the EL device. During operation of the EL device, a potential 20 is connected between the anode 4 and the cathode 14 so as to cause light L to be emitted from the EL device. During operation of the EL device, a cooling gas G, such as N2 may be introduced into the chamber formed by the second glass 16, the sealant 18, and the anode 4/glass 2.

There follows specific examples of compounds, and processes of making them into EL devices, in accordance with embodiments of the present invention.

EXAMPLE 1

An OLED device was fabricated in accordance with the following. An ITO substrate, acting as the anode, was covered on one side thereof with a buffer layer by spin coating. The buffer layer was 80 nm thick and was comprised of PEDOT. This buffer layer also acts as a hole-transporting layer. $C_{60}$ fullerenes were covalently attached to a PPV derivative, i.e., PPV including a carbazole unit, with the $C_{60}$ concentration of about 50 wt % so as to form PPV-AFCAR. This PPV-AFCAR was used as a dopant in another PPV derivative, POMPV, to give a POMPV nano-composite doped by 1 wt % of PPV-AFCAR. This compound of PPV-AFCAR and POMPV was then disposed onto the PEDOT layer by spin coating to a thickness of 80 nm, and was used as an emissive layer. PBD was then disposed on the emissive layer by vacuum evaporation to a thickness of 20 nm, for use as an electron transport layer. Next, LiF was disposed on the PBD by vacuum evaporation to a thickness of 0.5 nm. Lastly, Aluminum was disposed on the LiF by vacuum evaporation to a thickness of 150 nm. The LiF and Al layers are used as a cathode of the OLED device.

Figure 4:
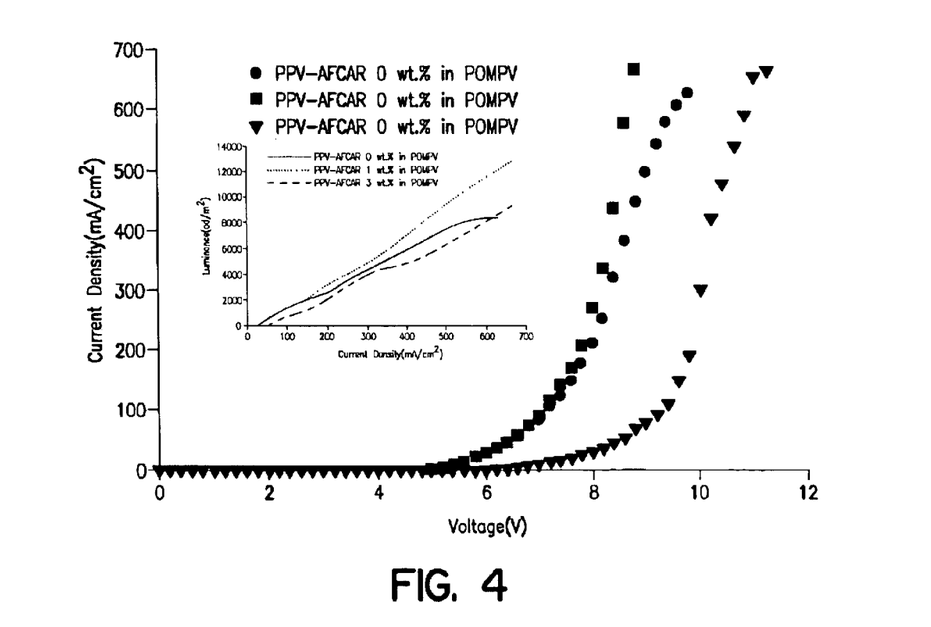
FIG. 4 is a graph showing voltage in relation to current density, and showing current density in relation to luminance for the EL devices of Example 1, Example 2, and the Comparative Example.

The OLED device of this example emits a bright yellow-green light with two main emission peaks at 502 nm and 538 nm, and had a rapid increase in current after turn on, as shown in FIG. 4. Also, the luminescent efficiency was up to 0.20 lm/w with the maximum luminance of about 13,000 $cd/m^2$ at the turn on voltage of 5.0 V. No current leak was detected.

EXAMPLE 2

An OLED was prepared in accordance with that of Example 1, except the POMPV was doped with 3 wt % of the PPV-AFCAR.

Again, the OLED emitted a bright yellow-green light with two main emission peaks at 502 nm and 538 nm. Because the OLED of this example had the same main EL peaks as that of the device in Example 1, and the device of the Comparative Example, infra, such implies that the PPV-AFCAR additive in the host polymer POMPV did not act as an excitation migration center. This may be due to too little an amount of PPV-AFCAR compared to that of POMPV.

Further, the OLED of this example had a higher turn-on voltage, 7.0 V, but the rate of current increase was about the same as that in Example 1 (FIG. 4). The maximum luminance in this example was 9,400 $cd/m^2$. No current leak was detected.

COMPARATIVE EXAMPLE

An OLED was prepared in accordance with that of Example 1, except the luminescent layer contained only pure POMPV; the luminescent layer included no dopant of nanostructures.

The emission peaks for the OLED of this example were the same as those for Examples 1 and 2, i.e., it emitted a bright yellow-green light. Further, the OLED of this example had a turn-on voltage of 5.0 V with a luminescent efficiency of 0.12 lm/w and a maximum luminance of 8200 $cd/m^2$ (FIG. 4).

In both Examples 1 and 2, the emitting layer (host polymer) acculated the holes so that after the OLED device was turned on, the current increase very rapidly. This also affects the luminance of the device, supporting a higher current density meant the higher recombination rate of the polaronic excitation. However, in Example 2, there may be an emission quenching effect by $C_{60}$, so the quenching is dominant with PPV-AFCAR concentrations approaching the 3 wt % after the competition between increasing of the recombination rate and the quenching. This was why the luminance decreased for the Example 2 device (having 3 wt % of the PPV-AFCAR concentration) compared to that of the Exampl1 device (having 1 wt % of PPV-AFCA ). Additionally, the higher turn on voltage of the Example 2 device (having a higher concentration of $C_{60}$), as compared to the Example 1 device, implies the higher hole trapping by the nano-dispersed $C_{60}$, so the device needs a higher electric field to carry the same amount of current as the device of Example 1. However, the rates of current increase for the devices of both Examples 1 and 2 are about the same after the d vices are turned on. This is, again, due to the rapid flow of the accumulated charges (holes) after turn on.

For all of the above examples (Examples 1 and 2, as well as the Comparative Example), the exciting wavelength was found to be 425 nm. The absorption wavelength did not change for both pure polymer POMPV and the POMPV doped with PPV-AFCAR (the polymer nano-composite), except a little decrease in intensity. Further, the nano-composite has relatively lower photoluminescence (PL) intensity than that of the pure polymer. This may be due to hole trapping effects by the $C_{60}$ particles, or by light scattering out of the layer. That is, in the latter case, the exciting light source is scattered by the nano-particle, thus there is less energy transfer to the polymer. However, the decrease in PL was observed with $C_{60}$ as the dopant, which particle is much smaller than the exciting wavelength so that it is not effective as a light scattering particle. Thus, the $C_{60}$ acts as a hole trap. Such hole trapping effect could help to increase the OLEDs efficiency because the hole mobility can be controlled, thereby increasing the charge balance ratio (number of minority charge/number of majority charge) at the emissive layer. Therefore, it is important to include the dopant, $C_{60}$ in the above examples, in the emissive layer.

The present invention achieves many advantages by doping carbon nanostructures into the material layers that make up EL devices and, further, by uniformly distributing the doping carbon nanostructures through the various layers that make up EL devices. More particularly, doping carbon nanostructures into PPV, especially by first combining the carbon nanostructures with a PPV derivative, gives rise to many advantages.

First, doping carbon nanostructures into the layers of EL devices reduces the required driving voltage. Because the carbon nanostructures have excellent electrical conductivity, when they are doped into the layers of the EL device, they reduce the required driving voltage for the EL device as a whole. Also, because the carbon nanostructures are not degraded in the presence of water, they maintain their electrical conductivity, and the electrical conductivity of the EL device as a whole, even as the surrounding materials are degraded.

Second, doping carbon nanostructures into the layers of EL devices leads to a longer useful life for the EL device.

Because the carbon nanostructures reduce the required driving voltage, and are excellent in electrical conductivity, they reduce the amount of resistance heating within the EL device, thereby increasing the device's lifespan. Also, due to the increased electrical conductivity, the films that make up the EL device can be made thicker. And thicker films have better resistance to water penetration, which is a cause of degradation in EL devices.

Third, doping carbon nanostructures into the layers of EL devices enhances the brightness of the EL devices. Because of the excellent electrical conductivity of the carbon nanostructures, they have a homogenizing effect on the conductivity of the EL device as a whole. This homogenized conductivity improves the brightness of the EL device. Further, the carbon nanostructures act as hole trapping elements so, when they are present (especially in the luminescent layer), they increase the luminous efficiency by causing greater re-combination of holes and electrons in the luminous layer. That is, more specifically, without carbon nanostructures in the EL device (especially the luminous layer), the supply of electrons to the luminescent layer is inhibited due to: a low recombination frequency thereof with positive holes in the luminescent layer; leaking of positive holes into the cathode side, because the holes travel too quickly through the luminescent layer, so that the recombination occurs outside the luminescent layer; too many positive holes accumulate near the cathode so that the supply of electrons to the luminescent layer is reduced. This is an especially large problem when the luminescent layer is PPV. However, in the present invention, carbon nanostructures are doped into the EL device, especially the luminescent layer, so as to improve the recombination frequency thereof with the electrons by: slowing the traveling speed of the holes through the luminescent layer; and/or by increasing the supply of electrons to the luminescent layer because of a decrease in the leakage of positive holes to the cathode side. This controlled carrier mobility leads to better device performance. More specifically, the present invention achieves a higher luminance and external efficiency due to enhanced recombination dynamics.

Fourth, doping carbon nanostructures into the layers of EL devices leads to simplified manufacturing techniques. Because the carbon nanostructure-doped films in the EL devices can be made thicker, as described above, the films are easier to produce and can be produced with less costly processes.

Although doping carbon nanostructures into the layers of EL devices has many advantages, if the carbon nanostructures aggregate, they can lead to current leaks. Such current leaks degrade the performance of the EL device as a whole. Therefore, the present invention uniformly disperses the carbon nanostructures throughout the layer of the EL device into which they are doped. In order to more uniformly disperse the carbon nanostructures in a layer of an EL device, as well as to obtain a good connection between the dopant carbon nanostructures and the host material, the carbon nanostructures are first compounded with, or attached to, a derivative of the layer into which they will be doped. The compound, including the carbon nanostructures, is then doped into the material that forms the desired layer in an EL device. It is easy to form the desired layer of the EL device in this manner, therefore EL devices of the present invention easily can be synthesized in large quantities for industrial utilization. Further, such manner of forming the EL leads to excellent "batch-to-batch" stability and, finally, to excellent nano-compositing potential or dispersive abilities.

It is contemplated that numerous modifications may be made to the fullerene doped EL device of the present invention without departing from the spirit and scope of the invention as defined in the claims. For example, although the EL device has been described as including discrete layers that perform specific functions, such subdivision is formal and need not be the case. That is, each layer may perform a plurality of functions, and each function may be performed by a plurality of layers. Further, the plurality of materials making up the EL device may be mixed into one layer so that all of the above described functions are concurrently borne on the electrodes, i.e., there is an EL device of the so-called single layer type. For example, very generally, $Alq_3$ functions as an electron injection layer, an electron transportation layer, and an emission layer which issues green light, whereas the PPV-AFCAR doped POMPV acts as a luminous layer, and pure POMPV acts as a hole injection layer, a hole transportation layer, and an emission layer. If red emission is desired, the EL layer can be doped with a compound including coumarine.

Further, although the above-described examples relate to fullerenes, similar results can be achieved with carbon nanotubes that are: SWNTs; MWNTs; shortened; long; doped with boron; doped with nitrogen; and pure. Further, the present invention applies to the use of boron nitride nanotubes.

These and other modifications and variations of the present invention may be practiced by those of ordinary skill in the art, without departing from the spirit and scope of the present invention, which is set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A compound, for use in an EL device, comprising: from greater than 0 wt % to 3 wt % of a first substance comprising about 50 wt % carbon nanostructures and about 50 wt % of a PPV derivative; and the remainder comprising a second PPV derivative.

2. The compound according to claim 1, wherein th carbon nanostructures are single-walled nanotubes or multi-walled nanotubes.

3. The compound according to claim 1, wherein said first substance comprises 1 wt % of said compound.

4. The compound according to claim 1, wherein said first substance comprises a fullerene covalently linked to a PPV molecule containing a carbazole unit.

5. The compound according to claim 4, wherein said fullerene comprises $C_{60}$.

6. The compound according to claim 4, wherein the PPV molecule containing a carbazole unit comprises poly [(2,5-di-pentoxyl-phenylene)-4-diylvinylene-3,6-(9-(1-azafulleroid-propyl) carbazolenevinylene)].

7. The compound according to claim 1, wherein said second PPV derivative comprises poly{1,4[2-(3,7-dimethyloctyloxy)3,5,6-trimethoxy]phenylene vinylene}.

8. A compound for use in an EL device, comprising:
   a first substance comprising a carbon nanostructure covalently linked to a PPV molecule containing a carbazole unit; and
   a second substance comprising a PPV derivative different from said PPV molecule containing a carbazole unit.

9. The compound according to claim 8, wherein said carbon nanostructure is a fullerene.

10. The compound according to claim 8, wherein th PPV containing a carbazole unit is poly [(2,5-di-pentoxyl-phenylene)-4-diylvinylene-3,6-(9-(1-azafulleroid-propyl) carbazolenevinylene)].

11. The compound according to claim 8, wherein said first substance comprises from greater than 0 wt % to 3 wt % of said compound, and said second substance comprises the remainder.

12. The compound according to claim 8, wherein said first substance comprises 1 wt % of said compound, and said second substance comprises the remainder.

13. The compound according to claim 8, wherein said PPV derivative of said second substance comprises poly{1, 4[2-(3,7-dimethyloctyloxy)3,5,6-trimethoxy]phenylene vinylene}.

14. An EL device comprising:
   a cathode;
   an anode;
   a light emitting layer disposed between said cathode and said anode, whereby when a potential is applied across said cathode and said anode, wherein said light emitting layer emits light and comprises the compound set forth in claim 1.

15. The EL device according to claim 14, wherein th light emitting layer comprises one or more sublayers, at least one of the sublayers including the compound set forth in claim 1.

16. The EL device according to claim 15, wherein at least one of the sublayers is an emitting layer, the emitting layer comprising the compound in an amount to allow for a recombination zone to be formed at the emitting layer.

17. The EL device according to claim 14, wherein the light emitting layer comprises a buffer layer disposed on the anode, a hole transport layer disposed on the buffer layer, an emitting layer disposed on the hole transport layer, and an electron transport layer disposed on the emitting layer.

18. The EL device according to claim 14, wherein the light emitting layer comprises a buffer layer disposed on the anode, an emitting layer disposed on the buffer layer, and an electron transport layer disposed of the emitting layer, wherein the buffer layer also functions as a hole transportation layer.

19. An EL device comprising:
   a cathode;
   an anode;
   a light emitting layer disposed between said cathode and said anode, whereby when a potential is applied across said cathode and said anode, wherein said light emitting layer emits light and comprises the compound set forth in claim 8.

20. The EL device according to claim 19, wherein th light emitting layer comprises one or more sublayers, at least one of the sublayers including the compound set forth in claim 8.

21. The EL device according to claim 20, wherein at least one of the sublayers is an emitting layer, the emitting layer comprising the compound in an amount to allow for a recombination zone to be formed at the emitting layer.

22. The EL device according to claim 19, wherein th light emitting layer comprises a buffer layer disposed on the anode, a hole transport layer disposed on the buffer layer, an emitting layer disposed on the hole transport layer, and an electron transport layer disposed on the emitting layer.

23. The EL device according to claim 19, wherein the light emitting layer comprises a buffer layer disposed on the anode, an emitting layer disposed on the buffer layer, and an electron transport layer disposed on the emitting layer, wherein the buffer layer is also a hole transport layer.

24. A method of making an EL device, comprising:
   providing a substrate;
   covering said substrate with a buffer layer;
   depositing a layer of a compound onto said buffer layer, wherein said compound is as set forth in claim 1, and acts as an emissive layer;
   disposing an electron transport layer on said emissive layer; and
   disposing a cathode on said electron transport layer.

25. The method according to claim 24, wherein said step of providing a substrate includes providing a substrate of ITO.

26. The method according to claim 24, wherein said step of providing a buffer layer includes spin coating an 80-nanometer thick layer of PEDOT onto said substrate.

27. The method according to claim 24, wherein said step of disposing a compound on said buffer layer includes spin coating said compound onto said buffer layer so as to form a layer of 80 nanometers in thickness.

28. The method according to claim 24, wherein said step of disposing an electron transport layer on said emissive layer includes disposing a 20-nanometer thick layer of PBD onto said emissive layer by vacuum evaporation.

29. The method according to claim 24, wherein said step of disposing a cathode on said electron transport layer includes:
   disposing LiF onto said electron transport layer to a thickness of 0.5 nanometers by vacuum evaporation; and
   disposing an aluminum layer on said LiF by vacuum evaporation, wherein said aluminum layer has a thickness of 150 nanometers.

30. A method of making an EL device, comprising:
   providing a substrate;
   covering said substrate with a buffer layer;
   depositing a layer of a compound onto said buffer layer, wherein said compound is as set forth in claim 8, and acts as an emissive layer;
   disposing an electron transport layer on said emissive layer; and
   disposing a cathode on said electron transport layer.

31. The method according to claim 30, wherein said step of providing a substrate includes providing a substrate of ITO.

32. The method according to claim 30, wherein said step of providing a buffer layer includes spin coating an 80-nanometer thick layer of PEDOT onto said substrate.

33. The method according to claim 30, wherein said step of disposing a compound on said buffer layer includes spin coating said compound onto said buffer layer so as to form a layer of 80 nanometers in thickness.

34. The method according to claim 30, wherein said step of disposing an electron transport layer on said emissive layer includes disposing a 20-nanometer thick layer of PBD onto said emissive layer by vacuum evaporation.

35. The method according to claim 30, wherein said step of disposing a cathode on said electron transport layer includes:
   disposing LiF onto said electron transport layer to a thickness of 0.5 nanometers by vacuum evaporation; and
   disposing an aluminum layer on said LiF by vacuum evaporation, wherein said aluminum layer has a thickness of 150 nanometers.

* * * * *

UNITED STATES PATENT AND TRADEMARK OFFICE
CERTIFICATE OF CORRECTION

PATENT NO. : 6,833,201 B2
APPLICATION NO. : 10/356702
DATED : December 21, 2004
INVENTOR(S) : Richard Czerw, David Carroll and Kautaro Hoshi It is certified that error appears in the above-identified patent and that said Letters Patent is hereby corrected as shown below:

Column 10, line 43, "th" should be --the--
Column 11, line 1, "th" should be --the--; line 24, "th" should be --the--; line 39, "of" should be --on--; line 50, "th" should be --the--; and line 58, "th" should be --the--

Signed and Sealed this

Thirteenth Day of March, 2007

JON W. DUDAS
*Director of the United States Patent and Trademark Office*